United States Patent
Launay

[11] Patent Number: 6,111,303
[45] Date of Patent: Aug. 29, 2000

[54] NON-CONTACT ELECTRONIC CARD AND ITS MANUFACTURING PROCESS

[75] Inventor: François Launay, Epron, France

[73] Assignee: U.S. Philips Corporation, New York, N.Y.

[21] Appl. No.: 09/164,472

[22] Filed: Oct. 1, 1998

[30] Foreign Application Priority Data

Oct. 7, 1997 [FR] France .................................. 97 12475

[51] Int. Cl.[7] ........................... H01L 29/00; H01L 23/28; H01L 23/48; H01L 21/44; H01L 21/48

[52] U.S. Cl. .......................... 257/531; 257/737; 257/778; 257/787; 438/112; 438/124; 438/127

[58] Field of Search ..................... 257/414, 531, 257/778, 787, 737, 684, 773; 438/112, 124, 127

[56] References Cited

FOREIGN PATENT DOCUMENTS

0737935A2 10/1996 European Pat. Off. ..... G06K 19/077

*Primary Examiner*—David Hardy
*Assistant Examiner*—Jesse A. Fenty

[57] ABSTRACT

The card comprises an insulating support (1) supporting a winding (4) which is used as an antenna, and an integrated circuit (9) electrically connected to the ends (7, 8) of the winding. According to the invention, the support (1) comprises on a structured surface (2) a cavity (3) on the walls and the bottom of which the tracks of the winding (4) are found which are formed further on the structured surface. The cavity (3) also includes the ends (7, 8) of the winding and contains the integrated circuit (9) which is pressed against the tracks. The cavity (3) is furthermore filled up with a polymerized protection resin (14) and a layer of insulating material (15) covers the structured surface (2) to which it is bonded.

14 Claims, 3 Drawing Sheets

NON-CONTACT ELECTRONIC CARD AND ITS MANUFACTURING PROCESS

FIELD OF THE INVENTION

The present invention relates to a non-contact electronic card comprising an electrically insulating card support which supports at least a winding used as an antenna for the transfer of information that results from an inductive effect of an electromagnetic field and an integrated circuit electrically connected to the ends of said winding.

The invention also relates to a manufacturing and assembling process for such a card.

For several years, data carrier systems utilizing magnetic cards and electronic cards have become current use for the purpose of toll roads or distribution. More particularly, a highly convenient data carrier system is that of the non-contact electronic cards which permits of transmitting and receiving signals at a relatively short distance. In this system, electromagnetic waves transmitted by an interrogating device which can read and write cause a modification of the magnetic field near to a winding which forms an antenna, arranged in a responder, which happens to be a non-contact electronic card, for producing a voltage induced in the winding that forms the antenna and the voltage thus generated is used as a current source.

BACKGROUND OF THE INVENTION

Prior-art non-contact cards are manufactured in a rather complex manner, because they comprise more often than not a module formed by an interconnected integrated circuit and electric coil, which implies a series of preliminary operations before a single module is manufactured. With or without a module, these cards are laminated and have three or more layers of insulating material on top of each other, while their thickness is standardized at 0.76 mm. The multiplicity of the number of layers to be assembled renders this thickness hard to obtain with the right precision.

For a non-contact card not comprising a pre-manufactured support module of electric elements (integrated circuit and coil), European patent application EP 0 737 935 A2 is cited, but it would be considered that the assembly formed by the layer 1 which is sufficiently thin and has the same surface as the card, and the integrated circuit and the coil 6 which are attached thereto while being functional (see FIG. 1A of this patent application) form a module. It will be noted that in this pseudo-module the coil stretches out in the same plane that is the upper plane of the layer 1. For completing the card so that the electric elements are protected, it is also necessary to lay over the entire surface of the layer 1 a central layer of adhesive insulating paste-like material 9 for embedding the coil and the integrated circuit until a plane surface is obtained, and also to cover each side of the assembly thus obtained by a protective foil.

It is an object of the invention to provide a non-contact electronic card which does not comprise an intermediate module so as to reduce the number of operations necessary for its manufacture.

It is a further object of the invention to reduce the number of layers or foils of insulating material necessary for its manufacture to two.

SUMMARY OF THE INVENTION

These objects are achieved and the disadvantages of the prior art are diminished thanks to the fact that the electronic card as defined in the opening paragraph is characterized in that said card support comprises on a structured surface a cavity on the walls and bottom of which the tracks of said winding are found which are further formed on said structured surface, which cavity also includes said ends of the winding, in that said cavity also contains said integrated circuit against said tracks, further being filled up by a polymerized protective resin and in that a foil of insulating material covers said structured surface to which it is glued.

For obtaining such a non-contact electronic card, a preferred process is characterized in that it comprises the following steps:

providing a cavity in said support on a surface called structured surface, applying via an MID (Molded Interconnection Devices) technology on said structured surface the tracks of said winding which run on the walls and the bottom of said cavity, the latter also including the ends of the winding, positioning said integrated circuit in said cavity, establishing the electric connections connecting the contacts of the integrated circuit to the ends of said winding, filling said cavity with a protective resin which is then polymerized, applying a foil of insulating material against said structured surface of the support by bonding.

In this manner, an electronic card comprising only two layers of insulating material and well resistant to mechanical endurance tests is thus obtained with a small number of operations. The use of an MID technology permits of the application of electric tracks in a single step on a support which has a relief, in this case the structured surface of the card support which has a cavity in which the tracks are to run. In MID technology, the hot foil embossing technique is preferred. Resolutions of 200 $\mu$m may be attained by this process which is furthermore inexpensive and may be inserted well into an assembly line.

For the manufacturing step of the electric connections connecting the contacts of the integrated circuit to the ends of the winding, various solutions may be considered.

A preferred embodiment of this step comprises gluing the integrated circuit with a non-conductive glue by its base to the bottom of the cavity and then soldering the conductive wires between the contacts of the integrated circuit and the ends of the winding.

Another preferred embodiment of this same step comprises a flip-chip mounting technique of the integrated circuit, in which technique the connections are established by soldering, by insulating glue or by conductive glue at localized points, while the contacts of the integrated circuit have bumps. According to another flip-chip mounting technique, the connections are established by gluing in combination with a pressure, by means of an anisotropic electrically conductive glue in the form of a pre-shaped foil or a paste, in which case the contacts of the integrated circuit do not have bumps.

The cavity may be established in the card body by milling, but the card support with its cavity is preferably established according to an injection molding technique and may have bumps at the bottom of the cavity at the locations provided for the ends of the winding.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
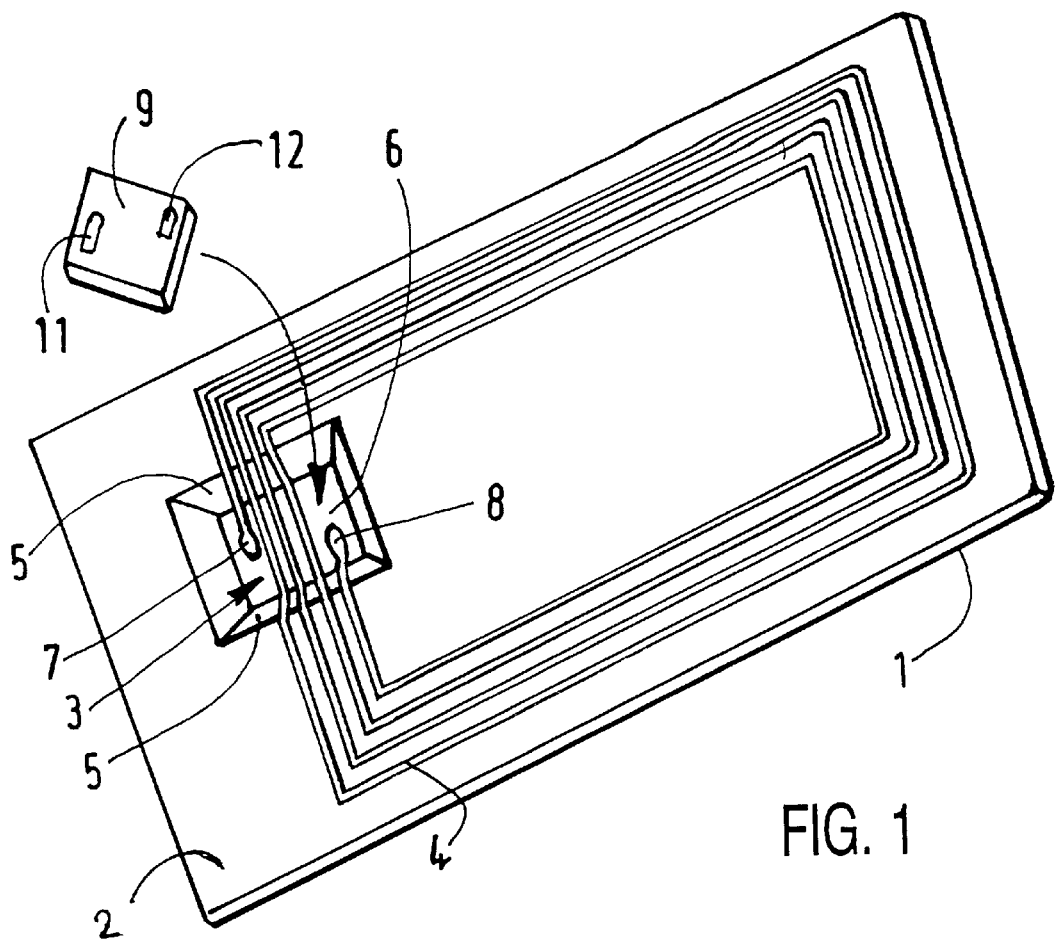
FIG. 1 is a perspective view of a part of the electronic card according to the invention before assembly.
Figure 2:
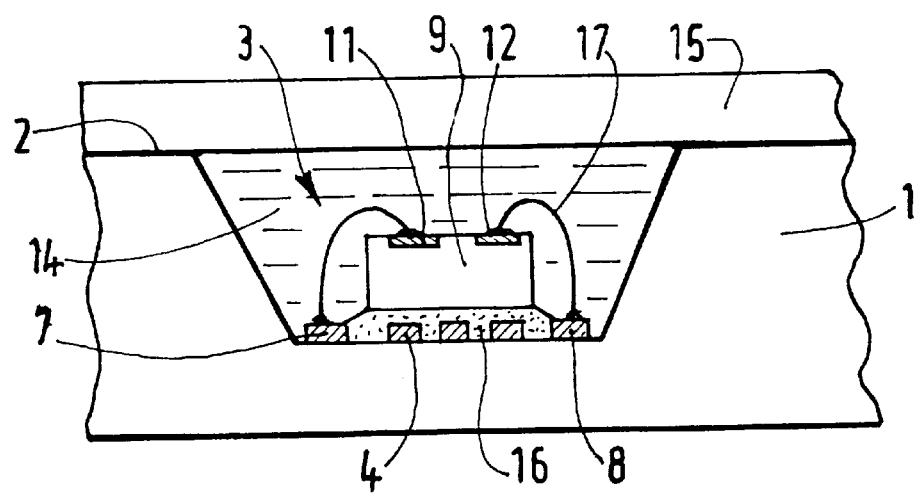
FIG. 2 is a cutaway cross-sectional view of a first embodiment of the invention.
Figure 6:
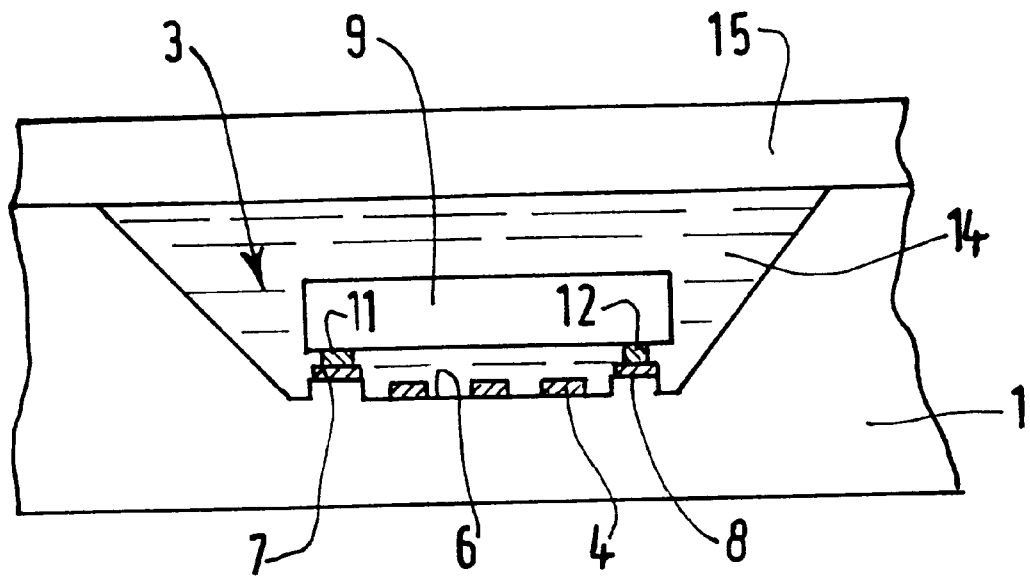
FIG. 6 is a view along section VI—VI of FIG. 5, this representation being the same as for FIG. 2

In FIG. 1 is represented a support 1 of a non-contact (contactless) electronic card. The support 1, which is electrically insulating, has on its upper surface 2 called structured surface a cavity 3 and a conductive winding 4 comprising a plurality of tracks which extend over the surface 2 and which, according to the invention, traverse the cavity 3 while passing over the walls 5 and the bottom 6 of the cavity 3. The two ends 7 and 8 of the winding are situated on the bottom of the cavity 3. Furthermore, there is provided that an integrated circuit (or chip) 9 is glued to the bottom 6 and that its two contacts 11 and 12 are electrically connected to the ends 7, 8 of the winding 4. When these operations are terminated, the cavity 3 is filled up with a protective resin 14 (see FIGS. 2 and 6) and a foil of insulating material 15, for example, polyvinyl chloride (PVC) is glued onto the structured surface 2 (FIGS. 2 and 6). The foil 15 could also be made of polycarbonate or of ABS. It will be noted that the foil 15 and the support 1 are preferably formed by the same material. When the support is formed by ABS or polycarbonate, the cavity 3 is realized by injection molding and when it is made of PVC, by spot facing.

The thickness of the support 1 and of the foil 15 and the depth of the cavity 3 are chosen so that the printed circuit 9 lies substantially halfway the thickness of the non-contact electronic card, that is to say, on the neutral fiber so as to form a proper resistance to constraints of bending of the card during its use. Preferably, the side walls 5 of the cavity are slightly inclined. The support 1 is realized with its cavity 3 preferably by injection molding of a thermoplastic material such as ABS or polycarbonate. It may also be made of PVC, in which case the cavity 3 is obtained by machining. The cavity 3 is to have a depth so that a sufficient thickness of plastic is left of more than 200 μm at the bottom of the card to avoid fracture of this card bottom and protect the silicon chip.

Various processes may be used for fixing the spiral tracks of the winding 4, substantially made of copper, to the support 1. Certain of these processes are described hereafter. It is also possible to make a choice between various processes for establishing electric connections connecting the contacts of the integrated circuit accommodated in the cavity to said ends of the winding 4 at the bottom of the cavity, which leads to various modes of embodying the invention.

The conventional embodiment represented in FIG. 2 comprises the mounting of integrated circuit 9 glued by its base by means of a layer 16 that can be polymerized, generally an epoxy glue, to the bottom of the cavity 3 and then the soldering of the conductive wires 17, for example made of gold or aluminum, between the contacts 11, 12 of the integrated circuit 9 and the ends 7, 8 of the winding 4. The various mounting and wiring methods of the integrated circuit are well known to those skilled in the art and are described in numerous publications, among which may be cited the patents FR 2 439 438, FR 2 548 857, EP 0 116 148 and FR 2 520 541.

As regards the wiring by soldering conductive wires, gold or aluminum wires may be used, although the gold wire is preferred for matters of rapidity (the thermosonic method used for soldering gold wires is three to four times faster than the soldering of aluminum wires). This operation is the most delicate of the assembling process, because it requires a preheating of the plastic support. As it is not desirable for this preheating to exceed the vitreous transition temperature Tg of the plastic support (risk of deformation), it is preferred that boards are used which are made of materials having a high Tg (polycarbonate, ABS, ABS-PVC compound, or ABS-polycarbonate compound).

After mounting and gluing of the chip, the operation of filling the cavity 3 may be carried out by a simple potting process which consists of the deposition of a drop of resin 14 in the cavity 3. To obtain a plane outside surface, resins of very low viscosity are preferably used such as, for example, resin having reference number 931-1 from the American ABLESTICK company. This resin must have a high ionic purity and have a good 30 resistance to water absorption in order to protect the silicon chip effectively during climatic tests. After its application in the cavity, the resin is polymerized which forms the final step in the manufacturing and assembling process according to the invention.

The last step consists of gluing by lamination of a PVC foil 15 onto the structured surface 2 of the support.

The preferred processes of applying conductor tracks 4 of the winding 4 to the support 1 on a non-planar three-dimensional surface are:

- hot foil embossing of a configuration of gluable tracks (turns),
- pad printing followed by metalization through autocatalysis,
- the realization of tracks by lithography obtained on the basis of laser holograms or three-dimensional masks.

From these three processes, the first two are well known and proved comparatively economical, but do not render a high resolution possible for the realization of the tracks. Where a high resolution is required, the third process may be used as it is more accurate.

The pad printing and lithographic techniques are compatible with the creation of bumps at the ends 7, 8 of the conductor tracks provided on the bottom of the cavity during injection-molding of the support 1.

Figure 3:
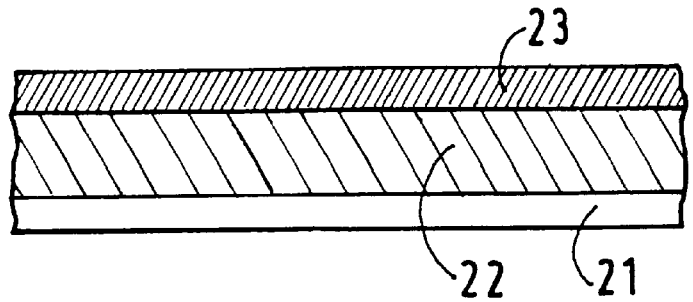
FIG. 3 shows in a cross-sectional view the structure of a conductive track having a hot reactivable glue usable for establishing an electronic card according to the invention.

The contents of patent EP 0 063 347 may be cited by way of example for the hot foil embossing (or stamping) method. A metal track configuration from 12 to 70 μm thick may be provided against the card support with a thermal cycle of a duration of the order of 2 s at the area of the cavity 3 of which the shape is designed for this purpose, that is, preferably with inclined walls, the application pressure being of the order of 80 N/mm$^2$ and the temperature of the order of 200° C. For this purpose, the foils for hot embossing which comprise the track configurations have the structure shown in FIG. 3: one or several layers of glue 21 can be reactivated by heat (usually a phenol-based glue), having a thickness from 1 to 4 μm, a copper layer 22, comparatively ductile, with a thickness lying between 12 and 35 μm, and possibly a tin or nickel layer 23 of a few μm thick. The portion of the foil which is not embossed may subsequently be removed by means of a winding station with an adhesive tape.

In the pad printing process, with a cycle duration of 2 s, a lacquer containing palladium may be imprinted on the card support 1, against the walls and the bottom of the cavity 3, and around the latter on the surface 2, in accordance with the pattern required for the metal track configuration to be created at that location. The printing quality is good, because it is possible here to obtain both a precision of the order of 50 μm for the width of the conductor tracks and for the interspacings between tracks.

The lacquer containing Pd, which forms a catalyst and which is deposited at accurate locations on the support 1, is subsequently heated to 100° C. Then a metalization (copper or nickel) is achieved by autocatalysis, the latter operation having been known and tested for a long time: the copper (nickel) is deposited on the support 1 only at locations where the catalyst is present. The thickness of the deposited copper lies between 1 and 10 μm. The main advantage of this electrochemical metalization is that several thousands to several tens of thousands of cards may be treated simultaneously, immersed together in the same bath, in the period of a few hours.

If a higher precision is necessary for the pattern of the conductor tracks in the cavity 3, it is possible to use a photolithographical process, which is more expensive than the preceding ones. This technique involves the transposition of the conventional photolithographical technique for metalizing plane surfaces to the metalization of skew surfaces, in this case the walls and the bottom of the cavity 3 and its immediate surroundings on the surface 2 of the support. For this purpose, a known focusing technique through 3D masks or a laser hologram has been developed, which involves the realization of the image of tracks in three dimensions on a surface that coincides with that of the cavity, which renders it possible to obtain the polymerization of a varnish exclusively in regions on the surface of the cavity where this is wanted.

For example, a semi-additive process may be used for realizing the tracks. This process, which is at present used in the main developed countries, comprises a treatment of the synthetic resin support to improve the adhesion of a deposited metal, preferably copper, on which subsequently electric contact layers are made to grow with the use of a photoresist mask. After exposure, the mask and the layers around the contacts are eliminated. This process thus renders metalizations possible on non-planar supports through the use of 3D masks or laser techniques (generation of holograms), and provides a resolution of the order of 50 μm. With the various metalization processes mentioned above, the electric contacts are no longer supported by a foil as in the prior art, but by the card support itself. In addition, the operations for providing through-holes through an insulating material for establishing the contacts are no longer necessary.

Figure 4:
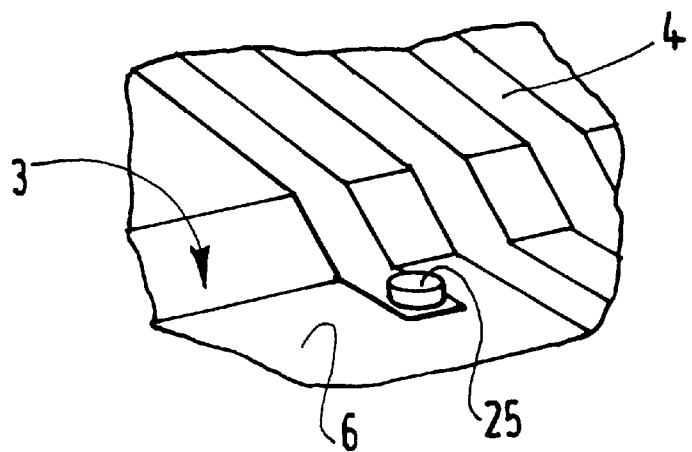
FIG. 4 shows in a perspective cutaway view the creation of bumps at the ends of the conductive tracks which form the winding.

Besides the conventional mounting technique shown in FIG. 2, a preferred technique as described below is that of flip-chip mounting. For this purpose, the ends 7, 8 of the winding 4 may comprise bumps whose configuration is symmetrical (relative to a plane) with that of the chip contacts with which they are to co-operate. Such bumps, diagrammatically represented by 25 in FIG. 4, are preferably realized during molding of the card support 1: their shape may be cylindrical as represented in FIG. 4, or have the shape of a spherical bulge, and their height is a few tens of μm. The metalization of the bumps may be effected simultaneously with that of the winding 4 by the pad printing or lithographical processes described above.

Figure 5:
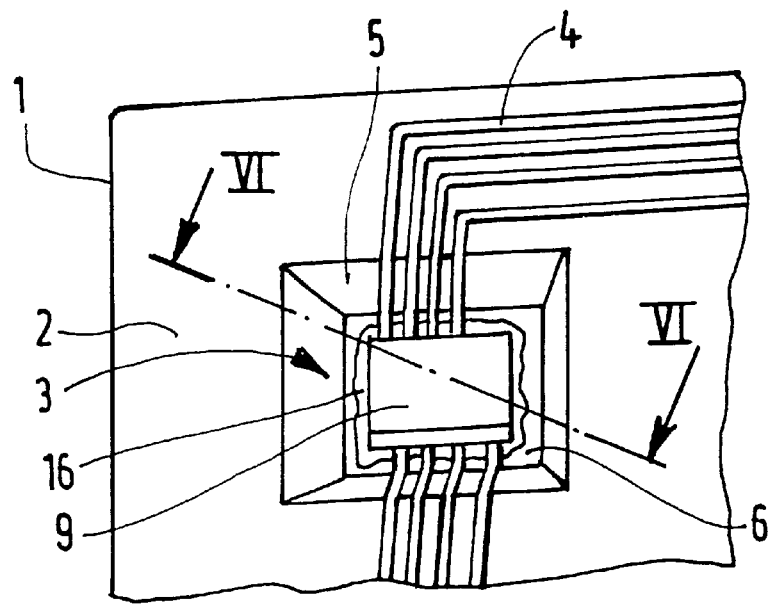
FIG. 5 shows in a cutaway plan view a second embodiment of the invention.

According to known, conventional flip-chip mounting processes, the contacts of the integrated circuit, made of aluminum, must be provided with bumps before mounting, which bumps are made of gold or copper through electroplating (which implies a delicate positioning operation of the integrated circuit after its manufacture) or by soldering gold "nailheads" by means of a conventional thermosonic gold soldering unit. Several processes are available for mounting, which involves the fixed interconnection in pairs of the bumps of the chip and those of the ends of the winding so that a good electric contact is established: quick heating of the chip in combination with a pressure which results in each pair of bumps being brazed together; or, alternatively, the application of a pressure in combination with an ultrasonic vibration at 60 kHz induced by the press which supports the chip (known for a long time for soldering conductive wires). A third connection process uses conductive glue, for example, an epoxy glue charged with 70% silver, previously deposited in the form of calibrated droplets exactly on the bumps at the ends 7, 8 of the winding 4, or on the bumps of the component through immersion of said bumps in a glue reservoir. These conventional techniques are represented in FIGS. 5 and 6, FIG. 6 being the section along line VI—VI of FIG. 5. They are described in more detail in patent applications WO 92/13319 and WO 92/13320. An insulating glue may also be used, which means that a deposition need not be carried out exactly on the metal bumps provided on the metalization pads of the component. In that case, a drop of insulating glue is deposited on the bottom of the cavity before the component is provided. During the pre-polymerization of the glue, it is necessary to apply a pressure on the component to obtain a good ohmic contact.

Figure 7:
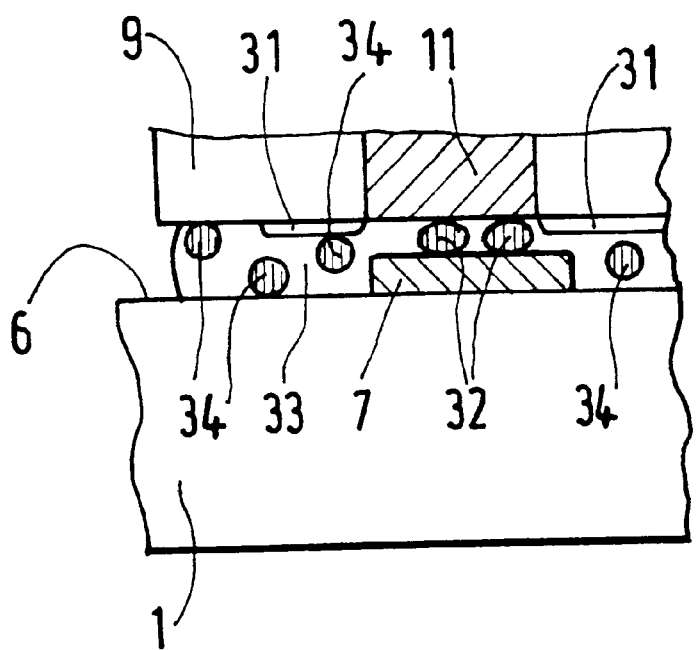
FIG. 7 represents in a cutaway cross-sectional view the detail of a preferred flip-chip mounting of the integrated circuit by means of an anisotropic conductive glue.

A preferred flip-chip mounting technique is shown in FIG. 7, though this is more critical than those indicated in the previous paragraph. Here the operation of providing bumps on the contacts of the chip may be dispensed with. The ends of the conductor tracks 9 on the bottom 6 of the cavity 3 may preferably still comprise bumps which are preferably of cylindrical shape (25, FIG. 4).

The glue used is a special anisotropic electrically conductive glue which is already used for surface mounting of passive components in particular. This type of glue contains conductive particles in a low concentration. These particles, which are elastically deformable and have a diameter of the order of 10 to 20 μm, provide electric conduction when they are compressed between two contacts, whereas the glue remains insulating at locations where there are no contacts. Square metalizations with sides of 100 μm, interspaced by 100 μm, are compatible with the use of these glues as far as the conduction aspect is concerned (particle density present over the metalization at the moment of gluing—there must in fact be several particles present rather than a single one, which would theoretically be sufficient, for achieving a good contact—), while the risk of short-circuits between conductor tracks is excluded. These glues are at present available in the form of foil (manufactured by the American 3M company or the Japanese HITACHI company), or in the form of a paste (manufactured by the American AIT and ZYMET companies or the German LCD MIKROELEKTRONIK company). UV-curing versions are available. For implementing the invention, the anisotropic glue in the form of paste is preferred to that in the form of foil. It will be noted that a compromise is to be found between the establishment of a good electric conduction at the level of each contact of the chip and the absence of short-circuits caused by agglomerations of particles between tracks when this contacting technique is used. With the dimensioning in the contacts as an equal constraint, this compromise is easier to achieve in proportion as it is possible to increase the concentration of particles while decreasing their size. It is necessary, however, for rendering this smaller size possible, to achieve a good planeness of the set of track ends on the bottom 6 of the cavity (while that of the contacts of the integrated circuit is achieved otherwise). Another element which favors the absence of short-circuits between tracks is the precision which can be obtained in the configuration of the track ends and in the correct positioning of the integrated circuit during gluing: a good precision in these two respects renders it possible to make the ends of the tracks narrower and thus to increase the interspacings between tracks, which reduces the probability of short-circuits.

FIG. 7 shows in detail the connections made with anisotropic glue. The integrated circuit 9 is shown with one of its contacts 11 facing the end 7 of the winding and a surface-passivating layer 31 between the contacts 11 and 12; the bottom 6 of the cavity in the card support 1 is provided with track ends 7, 8 which in this case do not have bumps. In the gluing process combined with a certain pressure, conductive particles such as 32 have become trapped in the glue 33 and subsequently compressed between the pairs of contacts 7 and 11. Other particles, such as 34, are situated outside the contacts and do not take part in any electric conduction. During the gluing operation, the integrated circuit has been prepositioned so as to have its metalization pads (contacts) substantially aligned with the track ends 4 (with or without bumps). A drop of anisotropic glue was deposited on the bottom of the cavity, and subsequently the integrated circuit was laid down and pressed onto the glue. The polymerization of the glue was subsequently effected, either by means of an oven or by means of an UV system (in the case of UV-curing resins).

As already described above with reference to FIG. 2, the cavity 3 is subsequently filled up (not shown) in a simple potting operation. The simplicity of this operation renders the use of a system possible which fills several cavities at a time, thus leading to high manufacturing capacities per unit of equipment. The resin used is preferably a resin of high ionic purity which offers good resistance to absorption of humidity and effectively protects the integrated circuit chip during bending and torsion of the card.

It is to be noted that the use of a glue for gluing the chip and of a protective resin which are mutually compatible and have the same polymerization modes (thermal or UV) renders it possible to carry out the gluing operation for the chip and the filling operation for the cavity with the same equipment. The sequence of operations is then the following:

gluing of the chip, filling of the cavity by means of a resin dispenser mounted on the gluing equipment loader, simultaneous polymerization of the glue of the integrated circuit and of the enveloping resin. In this case, it is indeed recommended to prepolymerize the anisotropic glue before its application on the bottom of the cavity. In this case, a single piece of equipment is capable of realizing the entire assembling operation.

After polymerization of the resin which fills up the cavity 3, the last operation consists, as it does for the embodiment of FIG. 2, of gluing a foil of insulating material, PVC, polycarbonate or ABS, preferably on the structured surface 2 of the support 1. This operation may be effected by cold or hot rolling.

It is advantageous to realize a plurality of cards on the same support in the form of a foil or in the form of a band, to carry out all the operations cited above up to the gluing by rolling the PVC foil and then to obtain the cards by sawing them at the press based on this common support.

As regards the making of bumps on the contacts of the integrated circuit for the embodiment of FIG. 6 (conventional flip-chip arrangement), various options are possible:

growth by electrodeposition, growth by evaporation, dispensing, impression, soldering.

The first four processes indicated above have two shortcomings:

too-high cost for the integrated circuits used for the electronic cards, difficult insertion into an assembly line.

The preferred process is that of soldering bumps by a conventional thermosonic wire soldering process to be carried out on the integrated circuit plates before they are sawn.

It will be noted that the non-contact (contactless) electronic card could comprise two windings, one for the supply of electric power and the other for exchanging data. The invention remains applicable in that case, the tracks of the two windings traversing the cavity for the integrated circuit and the ends of the two windings being situated at the bottom of the cavity. It is also to be noted that the invention is applicable to a mixed card, that is to say, a card that has both contacts for transmitting information by a galvanic channel and at least one winding for transmitting information by an electromagnetic channel.

What is claimed is:

1. A non-contact electronic card comprising an electrically insulating card support, which card support supports at least an inductive winding used as an antenna, and comprising an integrated circuit electrically connected to ends of said inductive winding, said non-contact electronic card comprising in said card support on a structured surface thereof a cavity, tracks of said inductive winding extending via walls of said cavity to a bottom of said cavity, said cavity including the ends of the winding, and said integrated circuit, contacts of said electronic circuit being connected to the ends of the inductive winding, said cavity further being filled up by a protective resin, the protective resin polymerizing after said cavity has been filled up by the protective resin, and a foil of insulating material covering said structured surface to which it is glued.

2. A non-contact electronic card as claimed in claim 1, wherein said inductive winding is a hot pressure glued winding, a hot reactivable glue having been applied to said winding before hot pressure gluing.

3. A non-contact electronic card as claimed in claim 1, wherein said contacts of said electronic circuit are soldered contacts having been soldered to the ends of the winding, soldering of said contacts having been done after gluing said electronic circuit to the bottom of the cavity.

4. A non-contact electronic card as claimed in claim 1, wherein said card support with said cavity is an injection molded card support with cavity, during injection molding bumps in said cavity having been formed for the ends of the winding.

5. A non-contact electronic card as claimed in claim 1, wherein said contacts are flip-chip connected to the ends of the winding so forming an electric connection, flip-chip connecting being an integrated circuit technique.

6. A non-contact electronic card as claimed in claim 5, wherein said electric connection is a combined glue and pressure connection, whereby an anisotropic electrically conductive glue in the form of pre-shaped foil or a paste has been applied, said contacts being bumpless contacts.

7. A non-contact electronic card as claimed in claim 6, wherein said anisotropic electrically conductive glue has been prepolymerized before establishment of said electric connection, and has been finally polymerized simultaneously with said polymerizing of the protective resin.

8. A manufacturing and assembling process for a non-contact electronic card, comprising an electrically insulating card support, which card support supports at least an inductive winding used as an antenna and comprising an integrated circuit electrically connected to ends of said inductive winding, the process comprising the following steps:

provided a cavity in said support on a structured surface thereof, applying on said structured surface tracks of said inductive winding, said tracks extending via walls of said cavity to a bottom of said cavity, said cavity including the ends of the inductive winding, positioning said integrated circuit in said cavity, establishing electric connections connecting contacts of the integrated circuit to the ends of the inductive winding, filling said cavity with a protective resin which is then polymerized, and applying a foil of insulating material against said structured surface of the support by glueing.

9. A manufacturing and assembling process as claimed in claim 8 according to which the step of applying tracks of said winding on said structured surface consists of hot pressure gluing of the tracks that have a hot reactivable glue.

10. A manufacturing and assembling process as claimed in claim 8 characterized in that said step of establishing electric connections comprises gluing the integrated circuit with a non-conductive glue by its base to the bottom of said cavity and then soldering the conductive wires between the contacts of the integrated circuit and the ends of said winding.

11. A manufacturing and assembling process as claimed in claim 8 characterized in that said card support is made with its cavity according to an injection-molding technique and has bumps at the end of the cavity at the locations provided for the ends of said winding.

12. A manufacturing and assembling process as claimed in one of the claim 8 characterized in that said step of establishing the electric contacts consists of a flip-chip mounting technique of the integrated circuit, said connections being established by soldering, by insulation gluing or by conductive gluing at localized points, while the contacts of the integrated circuit have bumps.

13. A manufacturing and assembling process as claimed in one of the claim 8 characterized in that said step of establishing the electric contacts comprises a flip-chip mounting technique of the integrated circuit, said connections being established by gluing in combination with a pressure, by means of an anisotropic electrically conductive glue in the form of pre-shaped foil or a paste in which case the contacts of the integrated circuit do not have bumps.

14. A manufacturing and assembling process as claimed in claim 13, characterized in that said anisotropic electrically conductive glue is prepolymerized before the step at which electric connections are established and in that its final polymerization is simultaneous with that of said protective resin.

* * * * *